United States Patent [19]

Kaufman et al.

[11] Patent Number: 5,184,074
[45] Date of Patent: Feb. 2, 1993

[54] REAL-TIME MR IMAGING INSIDE GANTRY ROOM

[75] Inventors: Leon Kaufman, San Francisco; David M. Kramer, San Rafael; Barry McCarten, Palo Alto; Mitsuaki Arakawa; Hillsborough; Christine Hawryszko, San Mateo, all of Calif.

[73] Assignee: The Regents of the University of California, Oakland, Calif.

[21] Appl. No.: 650,215

[22] Filed: Feb. 4, 1991

[51] Int. Cl.⁵ .............................. G01R 33/20
[52] U.S. Cl. ........................... 324/309; 324/318
[58] Field of Search ............. 324/300, 307, 308, 309; 358/93; 128/653.2, 653.3

[56] References Cited

U.S. PATENT DOCUMENTS

| | | | |
|---|---|---|---|
| Re. 33,505 | 12/1990 | Vinegar et al. | 324/320 |
| 4,486,708 | 12/1984 | Macovski | 324/309 |
| 4,573,014 | 2/1986 | Riederer | 324/307 |
| 4,739,766 | 4/1988 | Riederer | 324/309 |
| 4,830,012 | 5/1989 | Riederer | 324/309 |

Primary Examiner—Michael J. Tokar
Attorney, Agent, or Firm—Nixon & Vanderhye

[57] ABSTRACT

Continuously updated real-time magnetic resonance imaging processes are used to display an MR image volume to an operator and/or patient co-located with the MRI magnet, viewing console and other elements of an MRI system within the same shielded gantry room. A CRT display may be used for lower field MRI systems while liquid crystal displays may be necessary for higher field MRI systems since the viewing console is to be co-located within the shielded gantry room near the MRI magnet assembly. Suitable RF shielding is provided to RF-isolate the viewing console and its related power and video signal cables from the MRI RF coils being used to monitor relatively weak NMR signals emanating from the image volume within the magnet assembly. When used with open access MRI magnet assemblies, such real-time viewing of the image volume within the gantry room permits performance of simultaneous patient procedures guided by real-time visual feedback to the patient and/or doctor, nurse, patient attendant and the like while located within the gantry room and having direct access to the patient anatomy within the image volume.

16 Claims, 1 Drawing Sheet

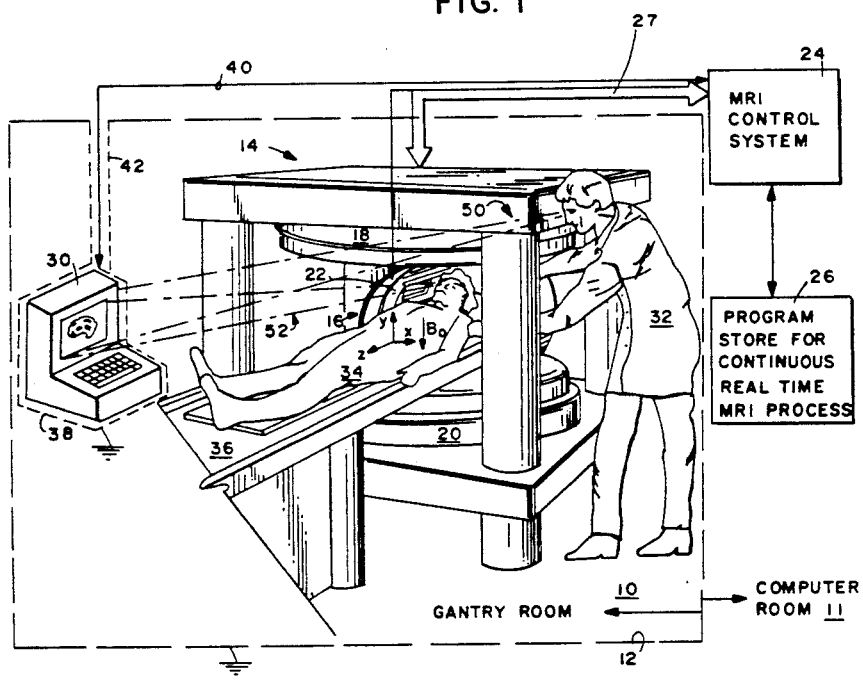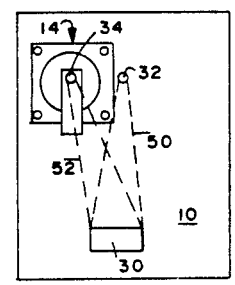

REAL-TIME MR IMAGING INSIDE GANTRY ROOM

This invention is related to magnetic resonance imaging (MRI) and/or similar imaging procedures utilizing nuclear magnetic resonance (NMR) phenomena. In particular, it is directed to continuous "real-time" MRI utilized in conjunction with a viewing monitor co-located within the same shielded gantry room as the MRI magnet, the patient being imaged, attending doctors and the like.

MRI is by now a well-known and readily available non-invasive imaging technique for use with living patients. To obtain the highest quality (e.g., high contrast, high resolution, high signal-to-noise ratio, etc) images, it may be necessary for a patient to lie essentially motionless for several minutes while sufficient MRI data is being acquired for subsequent processing into a high-quality visual image. However, so as to improve patient through-put, to facilitate location of patient anatomy within the imaged volume, to reduce motion artifact and perhaps for other reasons as well, many investigators have for quite some time been developing so-called fast-scan or rapid MRI data acquisition sequences.

One such fast-scan approach is described by Haacke et al in "Reduction of MR Image Time by the Hybrid Fast-Scan Technique," *Radiology*, February 1986, pp 521-529 and still others are described in other references cited therein. Other approaches are described by Wright et al, "Real-Time MR Fluoroscopic Data Acquisition and Image Reconstruction", Magn. Reson. Med. 12:407-415 (1989); by Holsinger et al, "Real-Time Interactive Magnetic Resonance Imaging", Magn. Reson. Med. 14:547-553 (1990); by Haase, "Snapshot FLASH MRI. Applications to $T_1$, $T_2$, and Chemical Shift Imaging", Magn. Reson. Med. 13:77-89 (1990) and by Riederer et al, "MR Fluoroscopy: Technical Feasibility", Magn. Reson. Med. 8:1-15 (1988). The contents of all these published accounts are hereby incorporated by reference.

Suffice it to note that there are by now several known rapid MRI sequences capable of producing images (albeit perhaps with reduced resolution, contrast, etc) in a few seconds or less (e.g., preferably less than one second per image and certainly substantially less than 5 seconds per image). In brief, such techniques utilize extremely short TR intervals (e.g., on the order of only 10 to 20 milliseconds) so as to acquire a complete set of MRI data in less than one second—and permit its processing into a visual image substantially immediately thereafter.

Accordingly, it is now known that some recognizable magnetic resonance images can be created repeatedly and continuously at rates on the order of one or more updated image per second. Those in the art will recognize that there are a number of available rapid MRI sequences capable of producing images in a few seconds (e.g. five) and preferably less than one second and that suitable computer hardware and software may be configured so as to acquire complete sets of MRI data, perform necessary reconstruction and display processes in a more or less continuous manner after such is initiated by an appropriate operator input.

Heretofore, such rapid sequences appear to have been implemented in conjunction with relatively high field MRI magnet systems (e.g., well in excess of 0.15 Tesla, such as 0.35 Tesla, 1.5 Tesla or even higher). In this context, the real-time image viewing screen has consistently been located outside the magnet gantry room (e.g., thus maintaining the typical CRT display away from adverse influences of a high strength magnetic field). Accordingly, while prior rapid MRI procedures may have already achieved many advantageous goals, they have not yet permitted those located within the gantry room (i.e., the patient and those attending the patient) to have a real time view of the MR imaged volume.

Although one earlier known low-field MR system did include its entire operating console (including a visual display) in the gantry room, this earlier system (by Instrumentarium Corporation, Helsinki, Finland) did not have any continuous updating or "real-time" imaging capability.

Actually, in systems which utilize a solenoidal magnet structure (e.g., all commercially available high field systems), real-time image viewing in the gantry room would have only limited utility because there is very little, if any, access to the patient imaging volume anyway. However, with modern open access low-field MRI magnet assemblies (e.g., see commonly assigned U.S. Pat. Nos. 4,829,252 and Des. 313,073 which are hereby incorporated by reference) it is possible for the patient to be manipulated within the MR image volume (e.g., for proper positioning of a particular part of the anatomy within the image volume, the placement of stereotaxic devices, interventions such as needle placements, etc). Accordingly, especially in the context of such open access relatively low field (e.g., on the order of 0.1 Tesla or less) MRI systems, there are many potential advantages and premiums to be had with continuous real-time viewing of the MR image volume directly inside the gantry room.

Even where extremely high field MR magnets are employed in the gantry room, presently available liquid crystal displays should also permit a real-time continuous viewing of the imaged volume in the gantry room (i.e., in the presence of such high strength fields).

Whether CRT or LCD displays are used, they are preferably suitably shielded or filtered so as to RF-isolate them from the usual MRI RF coils also necessarily present in the gantry room and used for processing relatively weak NMR RF signals from the imaged volume. To avoid generating RF noise in the gantry room, the television monitor (CRT or LCD) as well as the video signal and power cables feeding the monitor in the gantry room should be suitably shielded. For example, the monitor itself may be enclosed in its own screened enclosure which is electrically grounded to the screen of the gantry room itself. The video signals necessarily fed to the display in the gantry room may be fed via shielded coaxial cable. The outer shield should, of course, preferably be grounded to the gantry room shield at its point of entry to the gantry room and again to the smaller shielded enclosure of the video display apparatus. The typical 60 hertz power cables for the monitor may also be run through shielded conduits and/or be provided with conventional 60 hertz bandpass filtering so as to avoid generation of RF noise that might be undesirably coupled to the MRI RF coils located in the MR magnet assembly.

With this invention, a visual monitor may be maintained in the gantry room and used therein for viewing continuously updated real-time MR images. Preferably, the updating continues automatically without operator intervention once the process has been triggered by the operator to begin. This leaves the operator (who may also be an attending physician, radiologist, nurse, etc.) free to work with the patient in the gantry room. If the monitor is also within the viewing field of the patient, it permits patient feedback directly. In addition to useful bio-physical feedback uses, such feedback may also be useful in patient motion studies or even as a patient entertainment system during the initial setup procedures and the like.

In short, this invention permits a doctor or operator or patient to view rapidly updated real-time images of the MR image volume while still located in the gantry room. Such images may be utilized while positioning the patient for later higher quality MRI or while performing a procedure on the patient or a myriad of other useful purposes. Furthermore, these advantages can be had without necessitating intervention with conventional fast scan image data acquisition, processing and display procedures once the process has been started.

These as well as other objects and advantages of this invention will be more completely understood and appreciated by careful study of the following more detailed explanation of a presently preferred exemplary embodiment of this invention, taken in conjunction with the accompanying drawings, of which:

FIG. 1 is a schematic depiction of an MRI system having the usual background MRI magnet assembly in a screened gantry room and also including a visual monitor within the gantry room capable of displaying continuous real-time magnetic resonance images of patient anatomy within the imaged volume;

FIG. 2 is a schematic plan view of the gantry room to better illustrate exemplary patient and operator overlapping fields of view for the monitor in the gantry room.

As shown in FIG. 1, a gantry room 10 is typically provided with an electrically conductive and grounded screen 12 containing a static MRI background magnet 14 producing background static field $B_o$ as a necessary condition within the patient image volume 16 for performing magnetic resonance imaging processes. The exemplary "open access" low field permanent magnet assembly 14 depicted in the exemplary embodiment of FIG. 1, includes upper and lower magnet poles 18 and 20 and suitable magnetic gradient coils (located adjacent the magnet poles) for generating pulsed gradients $G_x$, $G_y$ and $G_z$ in the static magnetic field $B_o$ parallel to the usual three-dimensional coordinate axes x,y,z. RF coils 22 are also included and RF-coupled to the patient image volume 16 (located therewith) as will be apparent to those skilled in the art.

At least the magnetic gradient coils and RF coils are coupled to MRI control system 24 via conventional cabling 27. Typically, most of the computers, gradient driver amplifiers and the like are located in a separate computer room 11 adjacent to the gantry room 10. Such system typically also includes silicon or magnetic media program store 26. In the embodiment of FIG. 1, such program store 26 includes a program capable of effecting continuous real-time MRI processes upon an initial triggering command by the operator. Although an operator console may well also be found in the computer room 11, in the exemplary embodiment of FIG. 1 there is at least one visual display 30 physically located within the gantry room 10 and within the visual field 50 of at least the operator/attendant/physician 32. In the exemplary embodiment, the visual display 30 is also within the viewing field 52 of the patient 34 for at least some locations of the patient transport 36 when some portions of the patient anatomy are within the image volume 16. Thus, both the patient 34 and the operator 32 can continuously view patient anatomy located within imaged volume 16. This will permit, for example, the operator to perform procedures on the patient via the open access structure of the exemplary low-field MRI magnet 14 depicted in FIG. 1.

Since there will be at least video rate signalling within the display 30, it is suitably screened by its own grounded shield 38. Interconnecting power and video cables 40 may similarly be included within a screened conduit 42 or, in the preferred exemplary embodiment, the video signals will be within a shielded coaxial cable while the power cables will include the usual 60 cycle bandpass filtering at the entry point to gantry room 10. As will be appreciated, at least the front portion of the display screen 38 will have a sufficiently low density of conductive area so as to permit visual viewing through an array of small apertures in the screening.

Our presently preferred mode of rapid scan MRI is described more fully by Kramer et al in "Fluoroscopic MR Imaging at 0.064 Tesla" to be published in the IEEE Transactions on Nuclear Science, February 1991. As described therein, it is a system for ultra-fast MRI protocols at low field. The system design permits acquisition of raw data in background while reconstruction and display steps repeat as fast as possible in foreground. The performance speed that one can achieve depends partly on the desired use. One of the more attractive applications is a "real-time" locator scan. By collecting raw data at a rate of 20 milliseconds (TR) per echo with an echo delay (TE) of 9 milliseconds, a complete data cycle for a 128*64 image takes 1.28 seconds. However once a bit more than half of that data is incorporated into the reconstruction, the image appears complete. Using this set of parameters, one can get the rate of the reconstruction/display loop to paint about 2 times per completed raw data cycle showing an entirely new image at least once per second with an apparent frame rate of two per second. Interleaving of 2 or 3 orthogonal scans reduces the speed of update but provides better information.

Recently there have been several articles on ultra-fast scanning methods for MRI (as noted above). These include methods for "fluoroscopic" modes and pulse sequences with exceptionally fast repetition times (TR) on the order of 5 to 10 milliseconds leading to scan times of several hundred milliseconds. All of the work thus far has been at high field strengths ($\approx$1.5 Tesla). Our preferred mode involves fast MRI scanning protocols at low field. As already noted, there are several practical uses for this capability even at 0.064 Tesla (2.76 MHz for $H^1$ resonance).

There are several instances where such rapid scanning procedures have clinical utility. For initial localization of the patient's anatomy, one uses various fast "preview" scans. Rapid scans can also be used as an aid to interventional MR imaging. And with enough speed, it may be possible to directly visualize motion in the articulation of various joints: knee, temporo-mandibular joint, shoulder.

It is possible to update the current display with an entirely new image in less than one second. This is a practical rate for use as a "real-time" locator image for alignment of desired anatomic features into the image plane.

During the rapid scanning sequence, additional new data is added to the reconstruction buffer while previous buffer contents are reconstructed and input to the current display. Acquisition, reconstruction, and display all proceed (i.e. repeat) in a "continuous" manner so there is an apparent frame rate that is dependent only on the time for reconstruction and display. This rate is typically faster than a complete scanning sequence. The performance speed that one can achieve depends partly on the desired use. Further details of an exemplary implementation are described below.

The imaging system (ACCESS, Toshiba America MRI, Inc.) is controlled by a $\mu$VAX II computer (Digital Equipment Corp., Maynard, Mass.). The calculations are performed on a SKY Warrior array processor (Sky Computers, Inc., Maynard, Mass.). The system design permits acquisition of raw data directly into the array processor (A.P.) memory of which there is 2 megabytes. This allows enough room for up to 3 images of 256*256 pixels. The $N_{ro}*N_{pe}$2DFT reconstruction is started as soon as the first raw data arrives. The readout (RO)-direction Fourier transforms (FT) are performed only once. The phase encode (PE)-direction FT are performed on the last $N_{pe}$ lines that are in the data buffer for that slice. The system signal averages the data subsequent to readout FT. The A.P. memory must then be scaled and written to the display board memory.

In the fastest RF pulse sequence actually tested, raw data was collected at a rate of 20 milliseconds (TR) per echo with an echo delay (TE) of 9 milliseconds. To help maintain good signal-to-noise ratio, a sample pitch of 128 $\mu$seconds per point was used and $\frac{3}{4}$ of the gradient echo was sampled; i.e. 96 readout (RO) points. The section thickness may be, for example 15 mm. A complete data cycle for 64 phase-encoding (PE) steps takes 1.28 seconds. 44 lines was used in a fast scan with proportionately reduced resolution in the PE direction. The entire sequence of $N_{pe}$ steps is repeated continuously in a linearly varying PE gradient loop.

The recon/display steps are repeated as fast as possible in the foreground while additional raw data is appended to the circular input buffer of A.P. memory in the background. Some typical performance numbers are shown below for the total elapsed time between updates of the image display. (The time for 3 images is 3 times what is shown in the chart.) The image transfer contributes to determining the rate limiting step for frame update. For example, a 256*256 image requires $\approx$175 milliseconds.

TABLE I

| Image Update Performance Times | |
|---|---|
| Matrix Size ($N_{ro}*N_{pe}$*images) | Elapsed Time (seconds) |
| 256*64*3 | 0.53 |
| 256*64*1 | 0.50 |
| 256*128*3 | 0.78 |
| 256*128*1 | 0.78 |
| 128*128*3 | 0.47 |
| 64*64*3 | 0.17 |

Using the above sequence parameter one is able to get the rate of the recon/display loop to paint about 2 to 4 times per completed raw data cycle showing a new image at least one per second.

Accordingly, the exemplary magnetic resonance imaging system includes an MRI magnet with associated gradient coils, RF coils, patient transport and MRI display monitor all co-located within the same shielded gantry room 10. It also includes an MRI control system connected to the gradient coils and RF coils and to the viewing console for continuously performing MRI in real-time and providing an automatically continuously updated image sequence of a patient image volume within the magnet assembly on the viewing screen located within the gantry room. In the preferred exemplary embodiment, the continuously updated image sequence provides a new updated image on the viewing console at least once every second. It is conceivable that even slower continuous updating might have some utility (e.g., down to perhaps at least once every five seconds or so). However, the most preferred embodiments will most closely approach true real-time imaging of the image volume so as to be of most potential benefit to the operator and/or patient.

As already explained, this invention is especially useful where the MRI magnet includes upper and lower magnet poles disposed above and below the patient image volume with open side access areas to the image volume so as to facilitate performance of procedures on patient anatomy while located within the image volume and while simultaneously viewing real-time images on the viewing console. RF shielding is also associated in the exemplary embodiment with the viewing console itself and with any signal or power connections to that viewing console so as to effectively RF-isolate such components from the MRI RF coils also necessarily located in the gantry room. This avoids related noise artifact in the MRI RF signals necessarily being acquired via the RF coils. Lower field MRI open access magnet structures (e.g., having MRI static background fields of less than about 0.15 Tesla) may be used with the usual cathode ray tube display while higher field MRI magnets may necessitate the use of a liquid crystal display within the high field environment of the gantry room.

While only one exemplary embodiment of this invention has been described in detail, those skilled in the art will recognize that many variations and modifications may be made in this exemplary embodiment while yet retaining many of the novel features and advantages of this invention. All such variations and modifications are intended to be included within the scope of the appended claims.

What is claimed is:

1. A magnetic resonance imaging system comprising:
   a shielded gantry room;
   an MRI magnet with associated gradient coils, RF coils, patient transport and MRI viewing monitor all co-located within said shielded gantry room; and
   an MRI control system located outside said shielded gantry room and connected to said gradient coils, RF coils and viewing monitor and adapted to continuously perform MRI in real-time to provide on said viewing monitor within the shielded gantry room an automatically continuously updated image sequence of a patient image volume within said magnet.

2. A magnetic resonance imaging system as in claim 1 wherein said continuously updated image sequence provides a new updated image on said viewing monitor at least once every five seconds.

3. A magnetic resonance imaging system as in claim 1 wherein said continuously updated image sequence provides a new updated image on said viewing monitor at least once every one second.

4. A magnetic resonance imaging system as in claim 1 wherein said MRI magnet includes upper and lower magnet poles disposed above and below the patient image volume and having at least one open side access area to said image volume so as to facilitate performance of procedures on patient anatomy while located within the image volume and while simultaneously viewing real-time images thereof on said viewing console.

5. A magnetic resonance imaging system as in claim 4 wherein said viewing monitor is disposed for viewing by a patient while being at least partially located within the image volume.

6. A magnetic resonance imaging system as in claim 1 including RF shielding associated with said viewing monitor and with any signal or power connections thereto and disposed to RF-isolate such components from said RF coils thereby avoiding related noise artifact in MRI RF signals being acquired via the RF coils.

7. A magnetic resonance imaging system as in claim 1 wherein said viewing monitor includes a cathode ray tube display.

8. A magnetic resonance imaging system as in claim 1 wherein said viewing monitor includes a liquid crystal display.

9. A magnetic resonance imaging method comprising:
co-locating an MRI magnet with associated gradient coils, RF coils, patient transport and MRI viewing monitor all within the same shielded gantry room; and
continuously performing MRI in real-time to provide on said viewing monitor within the gantry room an automatically continuously updated image sequence of a patient image volume within said magnet.

10. A magnetic resonance imaging method as in claim 9 wherein said continuously updated image sequence provides a new updated image on said viewing monitor at least once every five seconds.

11. A magnetic resonance imaging method as in claim 9 wherein said continuously updated image sequence provides a new updated image on said viewing monitor at least once every one second.

12. A magnetic resonance imaging method as in claim 9 wherein said MRI magnet includes upper and lower magnet poles disposed above and below the patient image volume and having at least one open side access area to said image volume and further comprising performance of procedures on patient anatomy while located within the image volume and while simultaneously viewing real-time images thereof on said viewing monitor.

13. A magnetic resonance imaging method as in claim 12 wherein said viewing monitor is disposed for viewing by a patient while being at least partially located within the image volume.

14. A magnetic resonance imaging method as in claim 9 including RF shielding said viewing console and with any signal or power connections thereto and disposed to RF-isolate such components from said RF coils thereby avoiding related noise artifact in MRI RF signals being acquired via the RF coils.

15. A magnetic resonance imaging method as in claim 9 wherein said viewing monitor includes a cathode ray tube display.

16. A magnetic resonance imaging method as in claim 9 wherein said viewing monitor includes a liquid crystal display.

* * * * *